(12) United States Patent
Kim et al.

(10) Patent No.: US 10,570,315 B2
(45) Date of Patent: Feb. 25, 2020

(54) BUFFERED SLURRY FORMULATION FOR COBALT CMP

(71) Applicant: FUJIMI INCORPORATED, Aichi (JP)

(72) Inventors: Hooi-Sung Kim, Tualatin, OR (US); Anne Miller, Tualatin, OR (US)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 15/797,685

(22) Filed: Oct. 30, 2017

(65) Prior Publication Data

US 2018/0127618 A1 May 10, 2018

Related U.S. Application Data

(60) Provisional application No. 62/419,356, filed on Nov. 8, 2016.

(51) Int. Cl.
| | |
|---|---|
| *C09G 1/02* | (2006.01) |
| *H01L 21/302* | (2006.01) |
| *H01L 21/304* | (2006.01) |
| *H01L 21/461* | (2006.01) |
| *C09G 1/00* | (2006.01) |
| *H01L 21/306* | (2006.01) |
| *C09K 3/14* | (2006.01) |
| *C23F 4/00* | (2006.01) |
| *H01L 21/321* | (2006.01) |
| *C23F 3/04* | (2006.01) |

(52) U.S. Cl.
CPC ............. *C09G 1/02* (2013.01); *C09G 1/00* (2013.01); *C09K 3/1463* (2013.01); *C23F 3/04* (2013.01); *C23F 4/00* (2013.01); *H01L 21/302* (2013.01); *H01L 21/304* (2013.01); *H01L 21/30625* (2013.01); *H01L 21/3212* (2013.01); *H01L 21/461* (2013.01)

(58) Field of Classification Search
None
See application file for complete search history.

(56) References Cited

U.S. PATENT DOCUMENTS

| | | | |
|---|---|---|---|
| 5,264,010 A * | 11/1993 | Brancaleoni | B24D 3/346 106/3 |
| 2002/0098697 A1 | 7/2002 | Shimazu et al. | |
| 2004/0152309 A1* | 8/2004 | Carter | C03C 19/00 438/689 |
| 2008/0064211 A1 | 3/2008 | Tsugita et al. | |
| 2013/0140273 A1 | 6/2013 | Lu et al. | |
| 2013/0186850 A1 | 7/2013 | Wang et al. | |
| 2014/0099790 A1* | 4/2014 | Shi | H01L 21/30625 438/693 |
| 2014/0243250 A1 | 8/2014 | Miller et al. | |
| 2014/0335762 A1* | 11/2014 | Tamai | B24B 37/044 451/28 |
| 2015/0184029 A1* | 7/2015 | Grumbine | B24B 37/044 252/79.2 |
| 2017/0009101 A1* | 1/2017 | Yasui | B24B 37/044 |

FOREIGN PATENT DOCUMENTS

WO   WO 2015/129342   *   9/2015   ............... C09K 3/14

\* cited by examiner

*Primary Examiner* — Stephanie P Duclair
(74) *Attorney, Agent, or Firm* — Foley & Lardner LLP

(57) ABSTRACT

Described herein are polishing compositions containing an abrasive and a buffering material, wherein the pH of the polishing composition is about 6 to about 9, and methods of preparing and using the same.

13 Claims, 6 Drawing Sheets ent; the first component comprises a Lewis acid or a Bronsted-Lowry acid; and the second component comprises a compound devoid of a carboxylic acid moiety, with a pKa of about 6 to about 9 and wherein the difference between the pKa and the pH of the polishing composition at point of use is less than 1. In some embodiments, the abrasive comprises alumina, silica, or a combination thereof. In some embodiments, the abrasive is present in an amount of about 0.01 wt. % to about 10 wt. %. In some embodiments, the silica is precipitated silica. In some embodiments, the first component comprises acetic acid, ADA, bicine, boric acid, citric acid, 5,5-diethylbarbituric acid, EDTA, formic acid, glycine, glycylglycine, lactic acid, maleic acid, malic acid, phosphoric acid, picolinic acid, potassium hydrogen phthalate, potassium hydrogen tartrate, tricine, succinic acid, taurine, or a combination of two or more thereof. In some embodiments, the first component comprises a di- or tri-carboxylic acid. In some embodiments, the di- or tri-carboxylic acid is citric acid, malic acid, maleic acid, potassium hydrogen phthalate, potassium hydrogen tartrate, or succinic acid. In some embodiments, the first component is present in an amount of about 0.01 wt. % to about 1 wt. %. In some embodiments, the second component comprises ammonia, ACES, AMP, AMPD, AMPSO, BES, Bis-Tris, Bis-Tris-Propane, CAPSO, CHES, diethanolamine, DIPSO, EPPS, ethanolamine, N-ethylmorpholine, HEPBS, HEPES, HEPPSO, L-histidine, hydrazine, imidazole, MES, methylamine, N-methyldiethanolamine, MOBS, MOPS, MOPSO, morpholine, PIPES, piperazine, phosphate salt, POPSO, dihydrogen phosphate salt, potassium hydroxide, pyridine, hydrogen phosphate salt, TABS, TAPS, TAPSO, TEA, TES, Tris, or a combination of two or more thereof. In some embodiments, the second component comprises Tris, Bis-Tris, CHES, TAPS, TAPSO, HEPES, TES, MOPS, PIPES, or MES. In some embodiments, the second component comprises Tris, Bis-Tris, or CHES. In some embodiments, the second component is present in an amount of about 0.1 wt. % to about 4 wt. %. In some embodiments, the polishing composition further comprises a polishing accelerator. In some embodiments, the polishing accelerator is present in an amount of about 0.1 wt. % to about 10 wt. %. In some embodiments, the polishing accelerator is an amino acid. In some embodiments, the amino acid is glycine. In some embodiments, the polishing composition further comprises an oxidizer. In some embodiments, the oxidizer is present in an amount of about 0.1 wt. % to about 4 wt. %. In some embodiments, the oxidizer is hydrogen peroxide. In some embodiments, the pH of the polishing composition at point of use is about 6 to about 9. In some embodiments, the polishing composition further comprises a pH adjustor. In some embodiments, the pH adjustor is a base. In some embodiments, the base is potassium hydroxide or ammonium hydroxide. In some embodiments, the polishing composition is devoid of any corrosion inhibitor. In some embodiments, the polishing composition is devoid of any triazole-based corrosion inhibitor.

In another aspect, provided herein are polishing compositions comprising an abrasive and a buffering material, wherein the pH of the polishing composition is about 6 to about 9. In some embodiments, the abrasive comprises alumina, silica, or a combination thereof. In some embodiments, the abrasive is present in an amount of about 0.01 wt. % to about 10 wt. %. In some embodiments, the silica is precipitated silica. In some embodiments, the buffering material comprises one or more compounds selected from the group consisting of acetate salt, acetic acid, boric acid, ACES, AMP, AMPD, AMPSO, BES, bicine, Bis-Tris, Bis-Tris-Propane, borate salt, boric acid, cacodylate salt, CAPSO, CHES, citrate salt, citric acid, diethanolamine, 5,5-diethylbarbituric acid, DIPSO, EDTA, EPPS, ethanolamine, N-ethylmorpholine, formate salt, formic acid, glycine, glycylglycine, HEPBS, HEPES, HEPPSO, L-histidine, hydrazine, imidazole, lactic acid, malate salt, maleate salt, maleic acid, malic acid, MES, methylamine, N-methyldiethanolamine, MOBS, MOPS, MOPSO, morpholine, PIPES, piperazine, phosphate salt, phosphoric acid, picolinic acid, POPSO, dihydrogen phosphate salt, potassium hydrogen phthalate, potassium hydrogen tartrate, potassium hydroxide, propionate, pyridine, hydrogen phosphate salt, sodium tetraborate decahydrate, TABS, TAPS, TAPSO, TEA, TES, tetraoxalate, tricine, trimethylamine, Tris, succinate salt, succinic acid, and taurine. In some embodiments, the buffering material is present in an amount of about 0.01 wt. % to about 4 wt. %. In some embodiments, the polishing composition further comprises a polishing accelerator. In some embodiments, the polishing accelerator is present in an amount of about 0.1 wt. % to about 10 wt. %. In some embodiments, the polishing accelerator is an amino acid. In some embodiments, the amino acid is glycine. In some embodiments, the polishing composition further comprises an oxidizer. In some embodiments, the oxidizer is present in an amount of about 0.1 wt. % to about 4 wt. %. In some embodiments, the oxidizer is hydrogen peroxide. In some embodiments, the pH of the polishing composition at point of use is about 6 to about 9. In some embodiments, the polishing composition further comprises a pH adjustor. In some embodiments, the pH adjustor is a base. In some embodiments, the base is potassium hydroxide or ammonium hydroxide. In some embodiments, the polishing composition is devoid of any corrosion inhibitor. In some embodiments, the polishing composition is devoid of any triazole-based corrosion inhibitor.

In another aspect, provided herein are methods of cobalt chemical-mechanical polishing comprising applying a polishing composition disclosed herein to a substrate comprising cobalt.

In another aspect, provided herein are uses of a polishing composition disclosed herein for cobalt chemical-mechanical polishing.

In another aspect, provided herein are methods of stabilizing the cobalt removal rate in a chemical-mechanical polishing process for a substrate comprising cobalt, the method comprising applying a polishing composition disclosed herein to the substrate.

DETAILED DESCRIPTION

Figure 1:
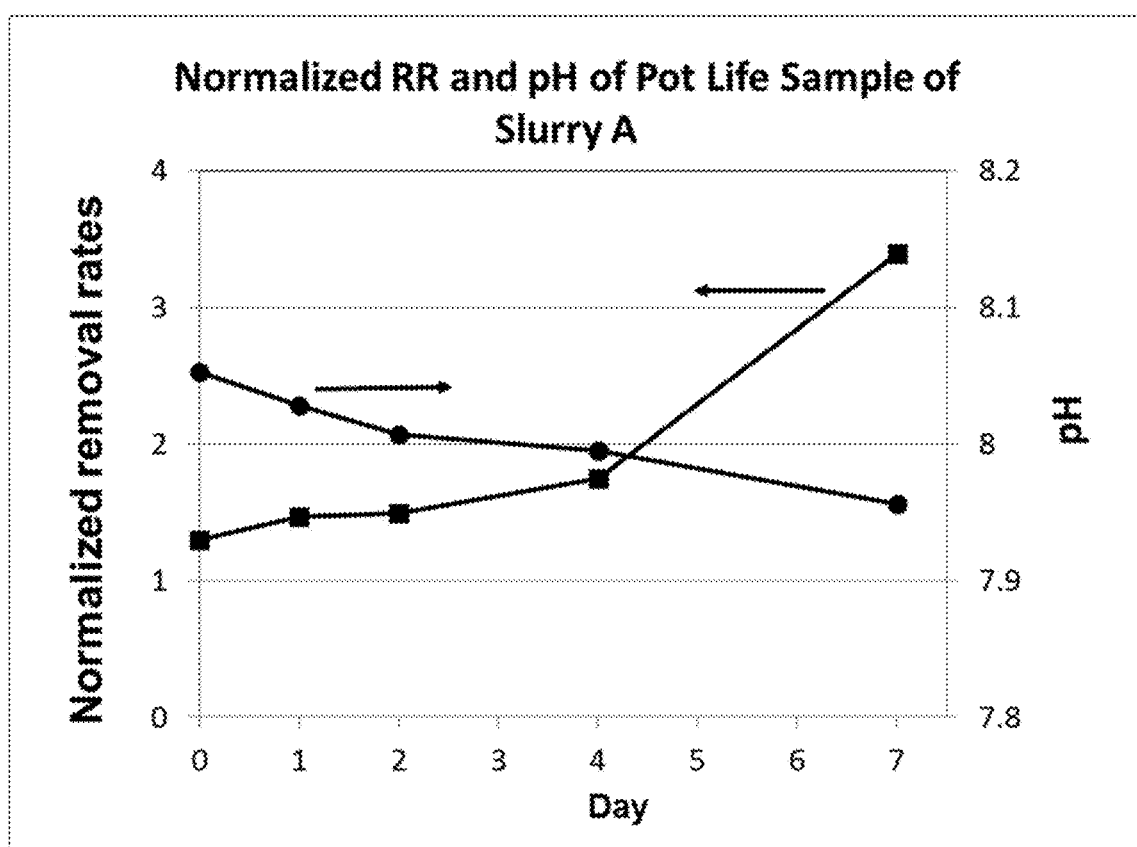
FIG. 1 depicts the changes in pH and cobalt removal rate during a 7-day pot life study of a comparative polishing slurry.

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s).

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term.

The use of the terms "a" and "an" and "the" and similar referents in the context of describing the elements (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the embodiments and does not pose a limitation on the scope of the claims unless otherwise stated. No language in the specification should be construed as indicating any non-claimed element as essential.

Provided herein, in one aspect, are polishing compositions for cobalt chemical-mechanical polishing (CMP). In some embodiments, the polishing compositions described herein exhibit more stabilized pH than previously disclosed polishing compositions. In some embodiments, the polishing compositions described herein exhibit more stabilized cobalt removal rate than previously disclosed polishing compositions. In some embodiments, the polishing compositions described herein exhibit more stabilized pH as well as more stabilized cobalt removal rate than previously disclosed polishing compositions. In further embodiments, the polishing compositions described herein exhibit better shelf life than previously reported polishing compositions.

Also provided herein, in another aspect, are polishing compositions comprising an abrasive and a buffering material, wherein the pH of the polishing composition is about 6 to about 9.

Also provided herein, in another aspect, are polishing compositions comprising an abrasive and a buffering material, wherein the buffering material comprises a first component and a second component; the first component comprises a Lewis acid or a Bronsted-Lowry acid; and the second component comprises a compound devoid of a carboxylic acid moiety, with a pKa of about 6 to about 9 and wherein the difference between the pKa and the pH of the polishing composition at point of use is less than 1. In some embodiments, the polishing composition comprises an abrasive and a buffering material, wherein the buffering material comprises malic acid and Tris. In some embodiments, the polishing composition comprises an abrasive and a buffering material, wherein the buffering material comprises malic acid and Bis-Tris. In some embodiments, the polishing composition comprises an abrasive and a buffering material, wherein the buffering material comprises malic acid and CHES. In further embodiments, the abrasive comprises precipitated silica.

Examples of abrasives include, but are not limited to alumina, silica, or combinations thereof. Silica includes precipitated silica, also typically called colloidal silica.

In some embodiments, the abrasive is present in an amount of about 0.01 wt. % to about 10 wt. %. This includes amounts of about 0.01 wt. % to about 8 wt. %, about 0.01 wt. % to about 5 wt. %, about 0.01 wt. % to about 3 wt. %, about 0.01 wt. % to about 1 wt. %, about 0.05 wt. % to about 10 wt. %, about 0.05 wt. % to about 8 wt. %, about 0.05 wt. % to about 5 wt. %, about 0.05 wt. % to about 3 wt. %, about 0.05 wt. % to about 1 wt. %, about 0.1 wt. % to about 10 wt. %, about 0.1 wt. % to about 8 wt. %, about 0.1 wt. % to about 5 wt. %, about 0.1 wt. % to about 3 wt. %, about 0.1 wt. % to about 1 wt. %, about 0.5 wt. % to about 10 wt. %, about 0.5 wt. % to about 8 wt. %, about 0.5 wt. % to about 5 wt. %, about 0.5 wt. % to about 3 wt. %, about 0.5 wt. % to about 1 wt. %, about 1 wt. % to about 10 wt. %, about 1 wt. % to about 8 wt. %, about 1 wt. % to about 5 wt. %, or about 1 wt. % to about 3 wt. %. In some embodiments, the abrasive is present in an amount of at least about 0.01, 0.05, 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, 1, 1.5, 2, 2.5, 3, 3.5, 4, 4.5, 5, 5.5, 6, 6.5, 7, 7.5, 8, 8.5, 9, 9.5, or 10 wt. %, including increments therein. In some embodiments, the abrasive is present in an amount of about 0.01, 0.05, 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, 1, 1.5, 2, 2.5, 3, 3.5, 4, 4.5, 5, 5.5, 6, 6.5, 7, 7.5, 8, 8.5, 9, 9.5, or 10 wt. %, including increments therein.

In some embodiments, the buffering material comprises a first component and a second component.

Illustrative first components include, but are not limited to, ADA (N-(2-acetamido)-iminodiacetic acid), acetic acid, bicine (N,N-bis(2-hydroxyethyl)glycine), boric acid, citric acid, 5,5-diethylbarbituric acid, EDTA, formic acid, glycine, glycylglycine, lactic acid, maleic acid, malic acid, phosphoric acid, picolinic acid, potassium hydrogen phthalate, potassium hydrogen tartrate, tricine (N-tris(hydroxymethyl)methylglycine), succinic acid, taurine, or a combination of two or more thereof. In some embodiments, the first component comprises a di- or tri-carboxylic acid. In further embodiments, the di- or tri-carboxylic acid is selected from the group consisting of citric acid, malic acid, maleic acid, potassium hydrogen phthalate, potassium hydrogen tartrate, succinic acid, or a combination of any two or more thereof. In some embodiments, the first component comprises malic acid.

In some embodiments, the first component is present in an amount of about 0.01 wt. % to about 1 wt. %. This includes about 0.03 wt. % to about 1 wt. %, about 0.05 wt. % to about 1 wt. %, about 0.07 wt. % to about 1 wt. %, about 0.1 wt. % to about 1 wt. %, about 0.15 wt. % to about 1 wt. %, about 0.2 wt. % to about 1 wt. %, about 0.25 wt. % to about 1 wt. %, about 0.3 wt. % to about 1 wt. %, about 0.35 wt. % to about 1 wt. %, about 0.4 wt. % to about 1 wt. %, about 0.45 wt. % to about 1 wt. %, about 0.5 wt. % to about 1 wt. %, about 0.55 wt. % to about 1 wt. %, about 0.6 wt. % to about 1 wt. %, about 0.65 wt. % to about 1 wt. %, about 0.7 wt. % to about 1 wt. %, about 0.75 wt. % to about 1 wt. %, about 0.8 wt. % to about 1 wt. %, about 0.85 wt. % to about 1 wt. %, about 0.03 wt. % to about 0.75 wt. %, about 0.05 wt. % to about 0.75 wt. %, about 0.07 wt. % to about 0.75 wt. %, about 0.1 wt. % to about 0.75 wt. %, about 0.15 wt. % to about 0.75 wt. %, about 0.2 wt. % to about 0.75 wt. %, about 0.25 wt. % to about 0.75 wt. %, about 0.3 wt. % to about 0.75 wt. %, about 0.35 wt. % to about 0.75 wt. %, about 0.4 wt. % to about 0.75 wt. %, about 0.45 wt. % to about 0.75 wt. %, or about 0.5 wt. % to about 0.75 wt. %. In some embodiments, the first component is present in an amount of at least about 0.01, 0.05, 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, or 1 wt. %, including increments therein. In some embodiments, the first component is present in an amount of about 0.01, 0.05, 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, or 1 wt. %, including increments therein.

Illustrative second components include, but are not limited to, ammonia, ACES (N-(2-acetamido)-aminoethanesulfonic acid), AMP (2-amino-2-methyl-1-propanol), AMPD (2-amino-2-methyl-1,3-propanediol), AMPSO (N-(1,1-dimethyl-2-hydroxyethyl)-3-amino-2-hydroxypropanesulfonic acid), BES (N,N-bis-(2-hydroxyethyl)-2-aminoethanesulfonic acid), Bis-Tris ([bis-(2-hydroxyethyl)-imino]-tris-(hydroxymethylmethane)), Bis-Tris-Propane (1,3-bis[tris(hydroxymethyl)-methylamino]propane), CAPSO (3-(cyclohexylamino)-2-hydroxy-1-propanesulfonic acid), CHES (cyclohexylaminoethanesulfonic acid), diethanolamine, DIPSO (3-[N-bis(hydroxyethyl)amino]-2-hydroxypropanesulfonic acid), EPPS (N-(2-hydroxyethyl)-piperazine-N'-3-propanesulfonic acid), ethanolamine, N-ethylmorpholine, HEPBS (N-(2-hydroxyethyl)piperazine-N'-(4-butanesulfonic acid)), HEPES (N-(2-hydroxyethyl)-piperazine-N'-ethanesulfonic acid), HEPPSO (N-(2-hydroxyethyl)-piperazine-N"-2-hydroxypropanesulfonic acid), L-histidine, hydrazine, imidazole, MES (2-(N-morpholino)ethanesulfonic acid), methylamine, N-methyldiethanolamine, MOBS (4-(N-morpholino)butanesulfonic acid), MOPS (3-(N-morpholino)propanesulfonic acid), MOPSO, morpholine, PIPES (piperazine-N,N'-bis(2-ethanesulfonic acid)), piperazine, phosphate salt, POPSO (piperazine-N,N'-bis(2-hydroxypropanesulfonic acid)), dihydrogen phosphate salt, potassium hydroxide, pyridine, hydrogen phosphate salt, TABS (N-tris(hydroxymethyl) methyl-4-aminobutanesulfonic acid), TAPS (3-{[tris(hydroxymethyl)-methyl]-amino}-propanesulfonic acid), TAPSO (3-[N-tris(hydroxymethyl)-methylamino]-2-hydroxypropanesulfonic acid), TEA (triethanolamine), TES (2-{[tris(hydroxymethyl)methyl]amino}ethanesulfonic acid), Tris (tris(hydroxymethyl)methylamine), or a combination of any two or more thereof. In some embodiments, the second component comprises Tris, Bis-Tris, CHES, TAPS, TAPSO, HEPES, TES, MOPS, PIPES, or IVIES. In some embodiments, the second component comprises Tris, Bis-Tris, or CHES. In some embodiments, the second component comprises Tris. In some embodiments, the second component comprises Bis-Tris. In some embodiments, the second component comprises CHES.

In some embodiments, the second component is present in an amount of about 0.1 wt. % to about 4 wt. %. This includes about 0.3 wt. % to about 3 wt. %, about 0.5 wt. % to about 3 wt. %, about 0.7 wt. % to about 3 wt. %, about 1 wt. % to about 3 wt. %, about 2 wt. % to about 3 wt. %, about 0.1 wt. % to about 2 wt. %, about 0.1 wt. % to about 3 wt. %, 0.3 wt. % to about 2 wt. %, about 0.5 wt. % to about 2 wt. %, about 0.7 wt. % to about 2 wt. %, about 1 wt. % to about 2 wt. %, about 0.1 wt. % to about 1 wt. %, 0.3 wt. % to about 1 wt. %, about 0.5 wt. % to about 1 wt. %, or about 0.7 wt. % to about 1 wt. %. In some embodiments, the second component is present in an amount of at least about 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, or 4.0 wt. %, including increments therein. In some embodiments, the second component is present in an amount of about 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, or 4.0 wt. %, including increments therein.

In some embodiments, the first component comprises a Lewis acid or a Bronsted-Lowry acid, and the second component comprises a compound devoid of a carboxylic acid moiety, with a pKa of about 6 to about 9. In some embodiments, the first component comprises malic acid and the second component comprises Tris. In some embodiments, the first component comprises malic acid and the second component comprises Bis-Tris. In some embodiments, the first component comprises malic acid and the second component comprises CHES.

In some embodiments, the buffering material comprises one or more compounds selected from the group consisting of acetate salt, acetic acid, boric acid, ACES, AMP, AMPD, AMPSO, BES, bicine, Bis-Tris, Bis-Tris-Propane, borate salt, boric acid, cacodylate salt, CAPSO, CHES, citrate salt, citric acid, diethanolamine, 5,5-diethylbarbituric acid, DIPSO, EDTA, EPPS, ethanolamine, N-ethylmorpholine, formate salt, formic acid, glycine, glycylglycine, HEPBS, HEPES, HEPPSO, L-histidine, hydrazine, imidazole, lactic acid, malate salt, maleate salt, maleic acid, malic acid, MES, methylamine, N-methyldiethanolamine, MOBS, MOPS, MOPSO, morpholine, PIPES, piperazine, phosphate salt, phosphoric acid, picolinic acid, POPSO, dihydrogen phosphate salt, potassium hydrogen phthalate, potassium hydrogen tartrate, potassium hydroxide, propionate, pyridine, hydrogen phosphate salt, sodium tetraborate decahydrate, TABS, TAPS, TAPSO, TEA, TES, tetraoxalate, tricine, trimethylamine, Tris, succinate salt, succinic acid, and taurine. In further embodiments, the buffering material is present in an amount of about 0.01 wt. % to about 4 wt. %. This includes about 0.01 wt. % to about 3 wt. %, about 0.03 wt. % to about 3 wt. %, about 0.05 wt. % to about 3 wt. %, about 0.07 wt. % to about 3 wt. %, about 0.1 wt. % to about 3 wt. %, about 0.2 wt. % to about 3 wt. %, about 0.3 wt. % to about 3 wt. %, about 0.4 wt. % to about 3 wt. %, about 0.5 wt. % to about 3 wt. %, about 0.6 wt. % to about 3 wt. %, about 0.7 wt. % to about 3 wt. %, about 0.8 wt. % to about 3 wt. %, about 0.9 wt. % to about 3 wt. %, about 1 wt. % to about 3 wt. %, about 1.1 wt. % to about 3 wt. %, about 1.2 wt. % to about 3 wt. %, about 1.3 wt. % to about 3 wt. %, about 1.4 wt. % to about 3 wt. %, about 1.5 wt. % to about 3 wt. %, about 1.6 wt. % to about 3 wt. %, about 1.7 wt. % to about 3 wt. %, about 1.8 wt. % to about 3 wt. %, about 1.9 wt. % to about 3 wt. %, about 2 wt. % to about 3 wt. %, about 2.1 wt. % to about 3 wt. %, about 2.2 wt. % to about 3 wt. %, about 2.3 wt. % to about 3 wt. %, about 2.4 wt. % to about 3 wt. %, about 2.5 wt. % to about 3 wt. %, about 2.6 wt. % to about 3 wt. %, about 2.7 wt. % to about 3 wt. %, about 2.8 wt. % to about 3 wt. %, about 2.9 wt. % to about 3 wt. %, 0.03 wt. % to about 2 wt. %, about 0.05 wt. % to about 2 wt. %, about 0.07 wt. % to about 2 wt. %, about 0.1 wt. % to about 2 wt. %, about 0.2 wt. % to about 2 wt. %, about 0.3 wt. % to about 2 wt. %, about 0.4 wt. % to about 2 wt. %, about 0.5 wt. % to about 2 wt. %, about 0.6 wt. % to about 2 wt. %, about 0.7 wt. % to about 3 wt. %, about 0.8 wt. % to about 2 wt. %, about 0.9 wt. % to about 2 wt. %, about 1 wt. % to about 2 wt. %, about 1.1 wt. % to about 2 wt. %, about 1.2 wt. % to about 2 wt. %, about 1.3 wt. % to about 2 wt. %, about 1.4 wt. % to about 2 wt. %, about 1.5 wt. % to about 2 wt. %, about 1.6 wt. % to about 2 wt. %, about 1.7 wt. % to about 2 wt. %, about 1.8 wt. % to about 2 wt. %, about 1.9 wt. % to about 2 wt. %, about 0.01 wt. % to about 1 wt. %, about 0.03 wt. % to about 1 wt. %, 0.05 wt. % to about 1 wt. %, 0.07 wt. % to about 1 wt. %, 0.1 wt. % to about 1 wt. %, 0.15 wt. % to about 1 wt. %, 0.2 wt. % to about 1 wt. %, 0.25 wt. % to about 1 wt. %, 0.3 wt. % to about 1 wt. %, 0.35 wt. % to about 1 wt. %, 0.4 wt. % to about 1 wt. %, 0.45 wt. % to about 1 wt. %, 0.5 wt. % to about 1 wt. %, 0.55 wt. % to about 1 wt. %, 0.6 wt. % to about 1 wt. %, 0.65 wt. % to about 1 wt. %, 0.7 wt. % to about 1 wt. %, 0.75 wt. % to about 1 wt. %, 0.8 wt. % to about 1 wt. %, 0.85 wt. % to about 1 wt. %, about 0.03 wt. % to about 0.75 wt. %, about 0.05 wt. % to about 0.75 wt. %, about 0.07 wt. % to about 0.75 wt. %, about 0.1 wt. % to about 0.75 wt. %, about 0.15 wt. % to about 0.75 wt. %, about 0.2 wt. % to about 0.75 wt. %, about 0.25 wt. % to about 0.75 wt. %, about 0.3 wt. % to about 0.75 wt. %, about 0.35 wt. % to about 0.75 wt. %, about 0.4 wt. % to about 0.75 wt. %, about 0.45 wt. % to about 0.75 wt. %, or about 0.5 wt. % to about 0.75 wt. %. In some embodiments, the buffering material is present in an amount of at least about 0.01, 0.05, 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, or 3.9 wt. %, including increments therein. In some embodiments, the buffering material is present in an amount of about 0.01, 0.05, 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, or 4.0 wt. %, including increments therein.

In some embodiments, the polishing composition further comprises a polishing accelerator. In some embodiments, the polishing accelerator is present in an amount of about 0.1 wt. % to about 10 wt. %. This includes about 0.1 wt. % to about 9 wt. %, about 0.1 wt. % to about 8 wt. %, about 0.1 wt. % to about 7 wt. %, about 0.1 wt. % to about 6 wt. %, about 0.1 wt. % to about 5 wt. %, about 0.1 wt. % to about 4 wt. %, about 0.1 wt. % to about 3 wt. %, about 0.1 wt. % to about 2 wt. %, about 0.1 wt. % to about 1 wt. %, about 0.1 wt. % to about 0.8 wt. %, about 0.1 wt. % to about 0.5 wt. %, about 0.5 wt. % to about 10 wt. %, about 0.5 wt. % to about 9 wt. %, about 0.5 wt. % to about 8 wt. %, about 0.5 wt. % to about 7 wt. %, about 0.5 wt. % to about 6 wt. %, about 0.5 wt. % to about 5 wt. %, about 0.5 wt. % to about 4 wt. %, about 0.5 wt. % to about 3 wt. %, about 0.5 wt. % to about 2 wt. %, about 0.5 wt. % to about 1 wt. %, about 0.5 wt. % to about 0.8 wt. %, about 1 wt. % to about 10 wt. %, about 1 wt. % to about 9 wt. %, about 1 wt. % to about 8 wt. %, about 1 wt. % to about 7 wt. %, about 1 wt. % to about 6 wt. %, about 1 wt. % to about 5 wt. %, about 1 wt. % to about 4 wt. %, about 1 wt. % to about 3 wt. %, about 1 wt. % to about 2 wt. %, about 3 wt. % to about 9 wt. %, about 3 wt. % to about 8 wt. %, about 3 wt. % to about 7 wt. %, about 3 wt. % to about 6 wt. %, about 3 wt. % to about 5 wt. %, about 3 wt. % to about 4 wt. %, or about 5 wt. % to about 10 wt. %. In some embodiments, the polishing accelerator is present in an amount of at least about 0.1, 0.2, 0.3, 0.4, 0.5, 0.6, 0.7, 0.8, 0.9, 1, 1.5, 2.0, 2.5, 3.0, 3.5, 4.0, 4.5, 5.0, 5.5, 6.0, 6.5, 7.0, 7.5, 8.0, 8.5, 9.0, 9.5, or 10.0 wt. %, including increments therein. In some embodiments, the polishing accelerator is present in an amount of about 0.1, 0.2, 0.3, 0.4, 0.5, 0.6, 0.7, 0.8, 0.9, 1, 1.5, 2.0, 2.5, 3.0, 3.5, 4.0, 4.5, 5.0, 5.5, 6.0, 6.5, 7.0, 7.5, 8.0, 8.5, 9.0, 9.5, or 10.0 wt. %, including increments therein. In some embodiments, the polishing accelerator is an amino acid. In further embodiments, the amino acid is glycine.

In some embodiments, the polishing composition further comprises an oxidizer. In some embodiments, the oxidizer is present in an amount of about 0.1 wt. % to about 4 wt. %. This includes about 0.3 wt. % to about 4 wt. %, about 0.5 wt. % to about 4 wt. %, about 0.7 wt. % to about 4 wt. %, about 1 wt. % to about 4 wt. %, about 2 wt. % to about 4 wt. %, about 3 wt. % to about 4 wt. %, about 0.1 wt. % to about 3 wt. %, about 0.3 wt. % to about 3 wt. %, about 0.5 wt. % to about 3 wt. %, about 0.7 wt. % to about 3 wt. %, about 1 wt. % to about 3 wt. %, about 2 wt. % to about 3 wt. %, about 0.1 wt. % to about 2 wt. %, 0.3 wt. % to about 2 wt. %, about 0.5 wt. % to about 2 wt. %, about 0.7 wt. % to about 2 wt. %, about 1 wt. % to about 2 wt. %, about 0.1 wt. % to about 1 wt. %, 0.3 wt. % to about 1 wt. %, about 0.5 wt. % to about 1 wt. %, or about 0.7 wt. % to about 1 wt. %. In some embodiments, the oxidizer is present in an amount of at least about 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3, 3.1, 3.2, 3.3, 3.4, 3.5, 3.6, 3.7, 3.8, 3.9, or 4 wt. %, including increments therein. In some embodiments, the oxidizer is present in an amount of about 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3, 3.1, 3.2, 3.3, 3.4, 3.5, 3.6, 3.7, 3.8, 3.9, or 4 wt. %, including increments therein. In some embodiments, the oxidizer is hydrogen peroxide.

In some embodiments, the pH of the polishing composition at point of use is about 6 to about 9. This includes a pH of about 6 to about 8, about 6 to about 7, about 7 to about 9, about 7 to about 8, or about 8 to about 9. The pH of the polishing composition may be adjusted during preparation of the raw slurry by adding a pH adjustor. In some embodiments, the pH adjustor is a base. In still further embodiments, the base is potassium hydroxide or ammonium hydroxide. In some embodiments, the base is potassium hydroxide. In some embodiments, the base is ammonium hydroxide. In some embodiments, the pH adjustor is an acid.

In some embodiments, the polishing composition is devoid of any triazole-based corrosion inhibitor. In some embodiments, the polishing composition is devoid of any corrosion inhibitor.

Methods/Uses

Provided herein, in another aspect, are methods of cobalt chemical-mechanical polishing (CMP) comprising applying a polishing composition described herein.

Provided herein, in another aspect, are uses of a polishing composition as described herein for cobalt CMP.

Provided herein, in another aspect, are methods of stabilizing the cobalt removal rate in a CMP process for a substrate comprising cobalt, the method comprising applying a polishing composition described herein. In some embodiments, the substrate is a wafer. In further embodiments, cobalt is located on an outer layer of the wafer. In some embodiments, the polishing composition removes cobalt but does not remove silicon-containing dielectric (e.g., $SiO_2$, SiN, SiC, SiOC, SiCN). In some embodiments, the wafer comprises one or more adhesion and/or barrier layers containing one or more of titanium nitride (TiN), tantalum nitride (TaN), Ti, and Ta, located between the cobalt layer and the interlayered dielectric (ILD). In further embodiments, one or more adhesion and/or barrier layers are left intact after the CMP process.

The present invention, thus generally described, will be understood more readily by reference to the following examples, which are provided by way of illustration and are not intended to be limiting of the present invention.

EXAMPLES

Example 1. Study of Comparative Glycine-Based Slurry (without Buffering Material)

A glycine-based slurry A (Table 1) was examined in a pot life study in ambient air environment (FIG. 1). Slurry A was mixed with deionized water and hydrogen peroxide at day 0 (bench top polisher; 250 rpm platen rotation speed; 90 mL/min slurry flow rate; 0.68% $H_2O_2$; Fujibo H7000 pad; dilution factor: 3.3×). A pH drop as well as a cobalt removal rate increase was observed after 7 days.

The comparative slurry A was further examined under conditions with or without a nitrogen purge. The pot life study conducted under a nitrogen atmosphere exhibited minimal pH change and maintained its cobalt removal rate. Without being bound to any one particular theory, it is believed that the carbon dioxide in air dissolves in the composition and decreases the pH during the pot life.

Figure 2:
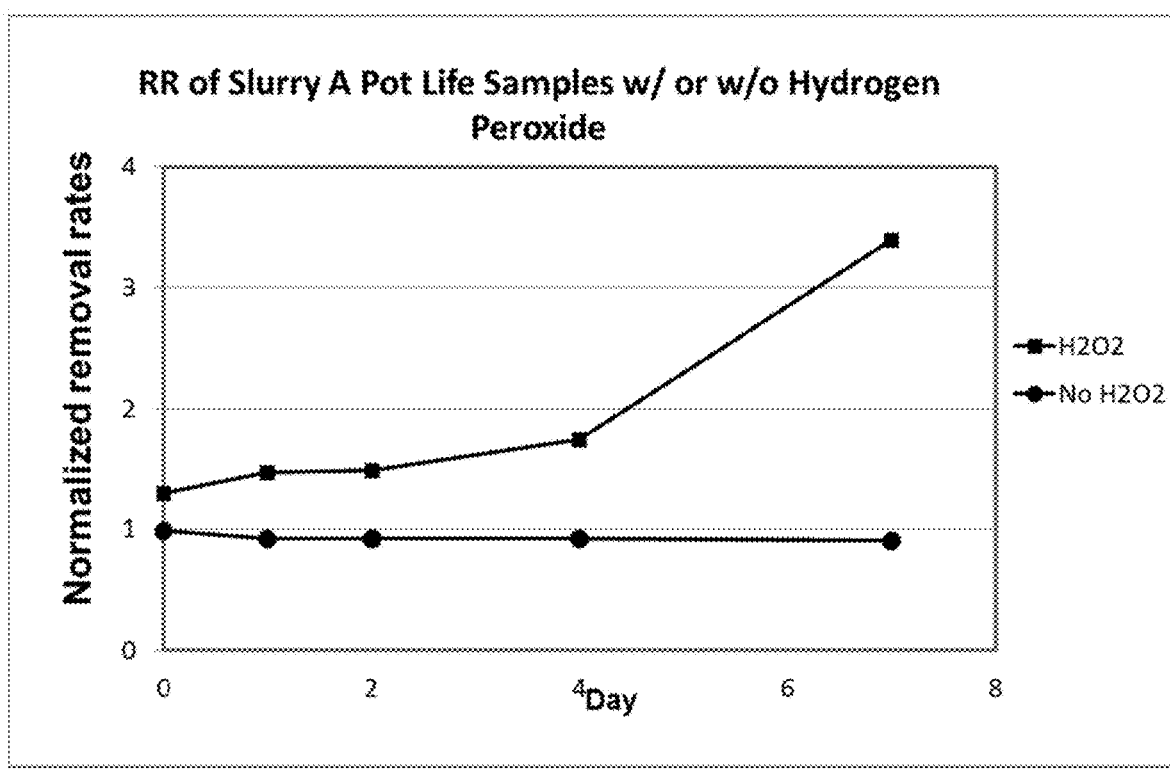
FIG. 2 depicts the changes in cobalt removal rate during a 7-day pot life study of the slurry of FIG. 1 with an analogous slurry wherein hydrogen peroxide is added only immediately before use (i.e., polishing).
Figure 3:
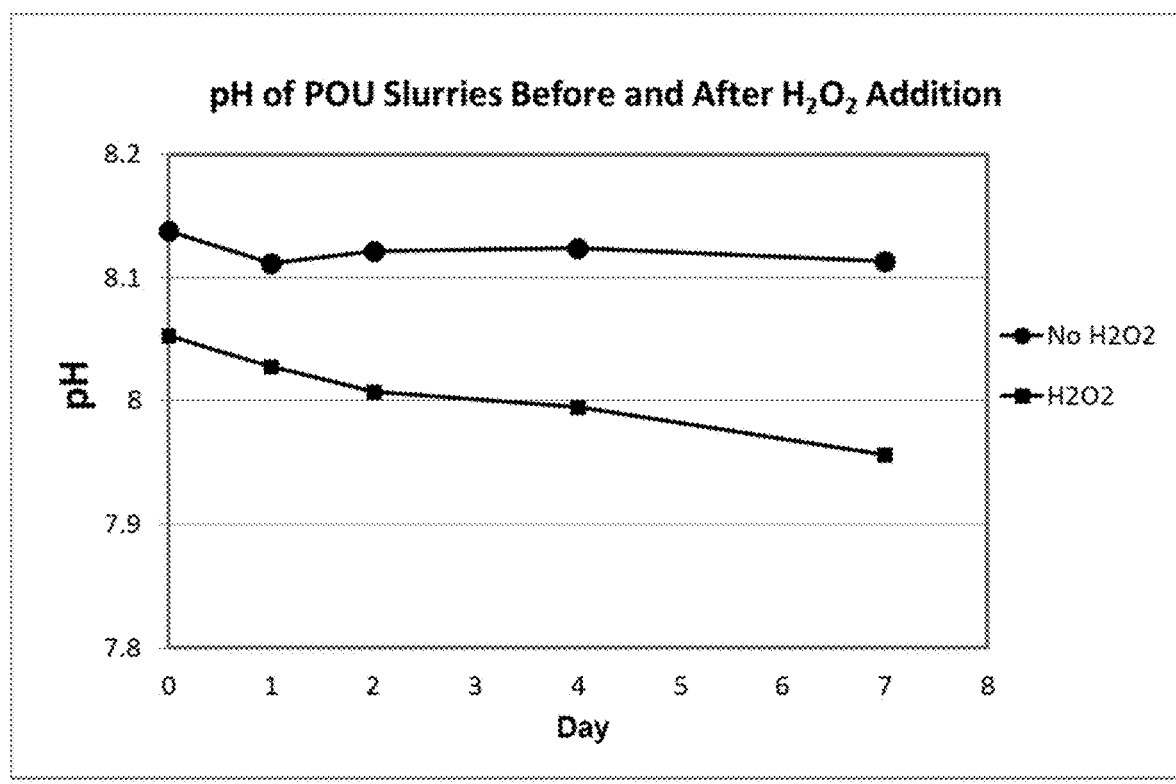
FIG. 3 depicts the changes in pH during a 7-day pot life study of the slurry of FIG. 1 with an analogous slurry wherein hydrogen peroxide is added only immediately before use (i.e., polishing).

The effect of the presence of hydrogen peroxide under ambient air conditions was also examined. Hydrogen peroxide was either added from day 0 or added immediately prior to testing (FIGS. 2 and 3). The results suggest that the presence of hydrogen peroxide from day 0 results in a pH drop and an increase in cobalt removal rate when the slurry is maintained under air.

Example 2. Study of Non-Limiting Example of Slurry with Buffering Material

Figure 4:
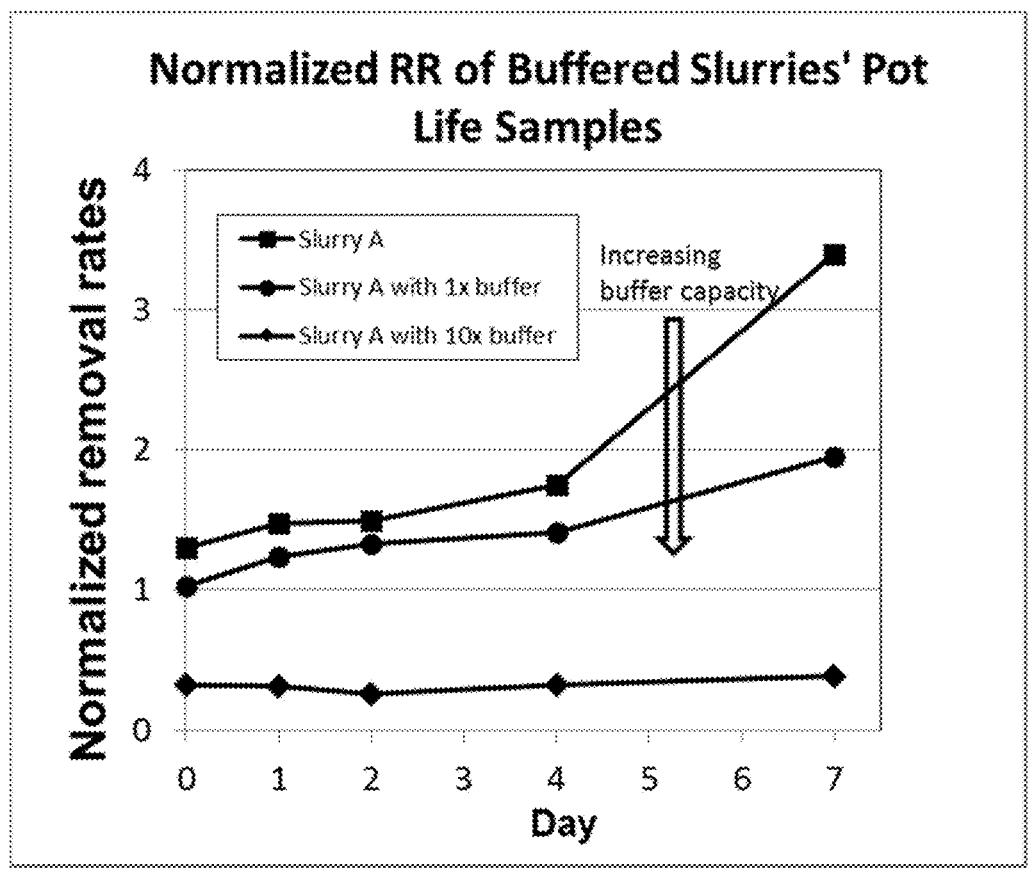
FIG. 4 depicts a 7-day pot life study and effects on pH and cobalt removal rate of a non-limiting example of a polishing composition disclosed herein.
Figure 5:
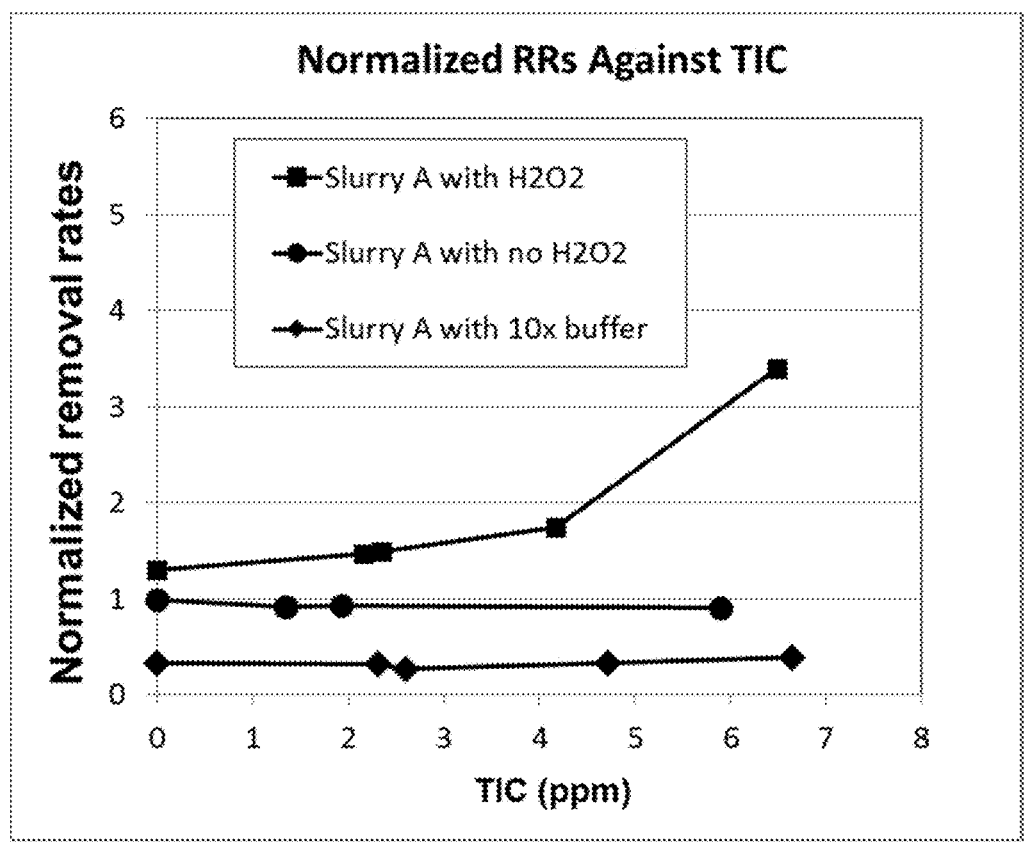
FIG. 5 depicts a 7-day pot life study and total inorganic cobalt concentration of the polishing composition of FIG. 4.

Slurry A (as described in Example 1), but further comprising malic acid and Tris (pKa of 8.06 at 25° C.), was prepared (Table 1) and examined. As concentration of the buffering material increased, less change in cobalt removal rate was observed (FIG. 4). The concentration of total inorganic carbon (TIC) was also examined (FIG. 5) for this buffering material-containing slurry A and the slurries from FIGS. 2 and 3.

TABLE 1

| Slurry | Slurry A | Slurry A -(with Tris) |
|---|---|---|
| pH (raw slurry) | 8.1 | 8.1 |
| particle | 1.38% | 1.38% |
| KOH | 0.05% | 0.05% |
| glycine | 3.64% | 3.64% |
| potassium laurate | 0.004% | 0.004% |
| biocide | 0.032% | 0.032% |
| malic acid | — | 0.31% |
| Tris | — | 0.92% |

Figure 6:
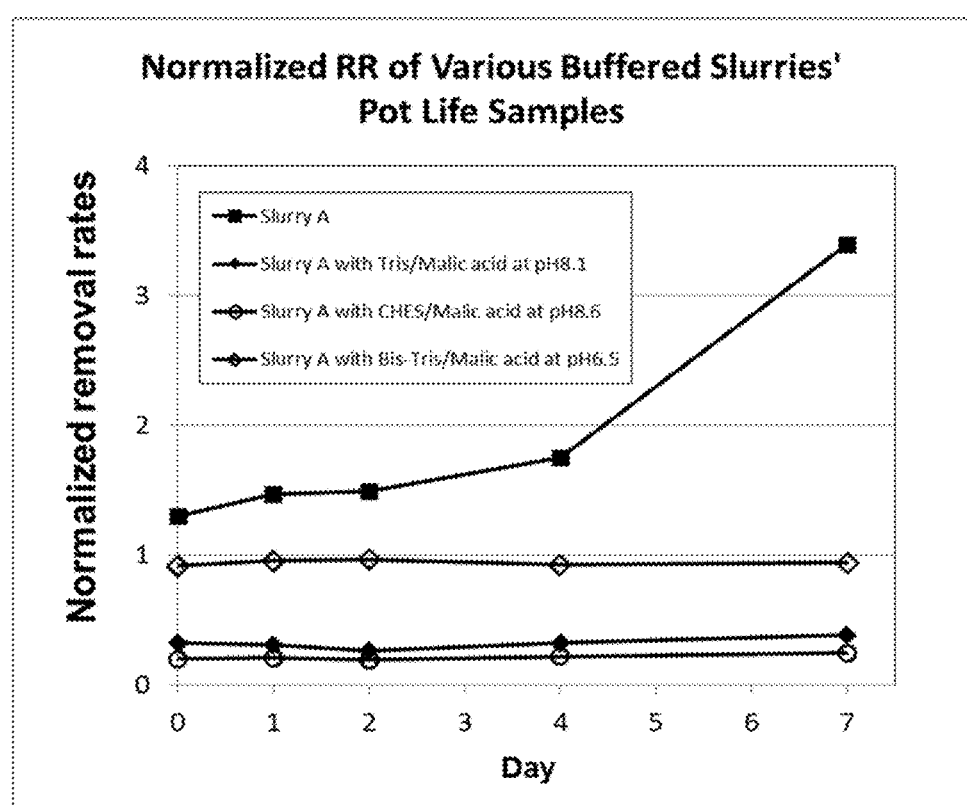
FIG. 6 depicts a 7-day pot life study and effects on cobalt removal rate of non-limiting examples of a polishing composition disclosed herein.

Example 3. Study of Additional Non-Limiting Examples of Slurries with Buffering Material Two slurries similar to slurry A (as described in Example 1), but further comprising malic acid and either Bis-Tris (pKa of 6.48 at 25° C.) or CHES (pKa of 9.50 at 25° C.), were prepared (Table 2) and examined. These slurries were compared with Slurry A and the slurry of Example 2. The slurries with malic acid and Tris, Bis-Tris, or CHES all maintained removal rates during a seven-day pot life study (FIG. 6), suggesting that the inclusion of buffering material is essential to avoid change in removal rate during the pot life study. Note: point of use (POU) sample included hydrogen peroxide (at POU) of 0.68 wt. % and a dilution factor of 3.3× by weight. conditions for the pot-life study: benchtop polisher, 150 rpm, 90 mL/min, 1.06 psi, Fujibo H7000 pad, coupon: 1.5 in×1.5 in.

TABLE 2

| Slurry | Slurry A - (with Bis-Tris) | Slurry A - (with CHES) |
|---|---|---|
| pH (raw slurry) | 6.5 | 8.6 |
| particle | 1.38% | 1.38% |
| KOH | — | 0.45% |
| glycine | 3.64% | 3.64% |
| potassium laurate | 0.004% | 0.004% |
| biocide | 0.032% | 0.032% |
| malic acid | 3.97% | 0.31% |
| Bis-Tris | 1.58% | — |
| CHES | — | 1.57% |

While certain embodiments have been illustrated and described, it should be understood that changes and modifications can be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, or compositions, which can of course vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Other embodiments are set forth in the following claims.

What is claimed is:

1. A polishing composition comprising an abrasive and a buffering material, wherein the buffering material comprises a first component and a second component; wherein
the first component comprises glycine; and
the second component comprises AMP, AMPD, AMPSO, diethanolamine, ethanolamine, HEPBS, HEPPSO, L-histidine, hydrazine, imidazole, methylamine, N-methyldiethanolamine, MOBS, morpholine, piperazine, dihydrogen phosphate salt, pyridine, hydrogen phosphate salt, TEA, Tris, or a combination of two or more thereof, with a pKa of about 6 to about 9 and wherein the difference between the pKa and the pH of the polishing composition at point of use is less than 1.

2. The polishing composition of claim 1, wherein the abrasive comprises alumina, silica, or a combination thereof.

3. The polishing composition of claim 2, wherein the silica is precipitated silica.

4. The polishing composition of claim 1, wherein the abrasive is present in an amount of about 0.01 wt. % to about 10 wt. %.

5. The polishing composition of claim 1, wherein the first component is present in an amount of about 0.01 wt. % to about 1 wt. %.

6. The polishing composition of claim 1, wherein the second component comprises Tris.

7. The polishing composition of claim 1, wherein the second component is present in an amount of about 0.1 wt. % to about 4 wt. %.

8. The polishing composition of claim 1, further comprising an oxidizer.

9. The polishing composition of claim 1, where the polishing composition is devoid of any corrosion inhibitor.

10. The polishing composition of claim 1, where the polishing composition is devoid of any triazole-based corrosion inhibitor.

11. The polishing composition of claim 1, wherein the first component further comprises a di- or tri-carboxylic acid.

12. A method of stabilizing a cobalt removal rate in a chemical-mechanical polishing process for a substrate comprising cobalt, the method comprising applying a polishing composition to the substrate, wherein the polishing composition comprises an abrasive, an oxidizer, and a buffering material, wherein the buffering material comprises a first component and a second component; wherein
the first component comprises a Lewis acid or a Bronsted-Lowry acid; and
the second component comprises a compound devoid of a carboxylic acid moiety, with a pKa of about 6 to about 9 and wherein the difference between the pKa and the pH of the polishing composition at point of use is less than 1; and
wherein an increase in cobalt removal rate over a time period is suppressed when compared to a polishing composition without the buffering material.

13. The method of claim 12, wherein the time period is 1 to 7 days.

* * * * *